(12) United States Patent
Jung

(10) Patent No.: US 8,649,900 B2
(45) Date of Patent: Feb. 11, 2014

(54) STOCKER SYSTEM AND METHOD OF MANAGING STOCKER

(75) Inventor: Ki-Chae Jung, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 1037 days.

(21) Appl. No.: 12/552,401

(22) Filed: Sep. 2, 2009

(65) Prior Publication Data

US 2010/0268374 A1 Oct. 21, 2010

(30) Foreign Application Priority Data

Apr. 21, 2009 (KR) ......................... 10-2009-0034715

(51) Int. Cl.
*G06F 7/00* (2006.01)

(52) U.S. Cl.
USPC .......................................... 700/218; 700/226

(58) Field of Classification Search
USPC ......................................................... 700/218
See application file for complete search history.

(56) References Cited

U.S. PATENT DOCUMENTS

| 6,534,777 B2 * | 3/2003 | Yamada et al. .......... 250/559.29 |
| 2009/0198371 A1 * | 8/2009 | Emanuel et al. .............. 700/226 |
| 2010/0254182 A1 | 10/2010 | Kuroiwa et al. |

FOREIGN PATENT DOCUMENTS

| JP | 3034286 | | 8/1996 | |
| JP | 08-310612 A | | 11/1996 | |
| JP | 08310612 A | * | 11/1996 | ............... B65G 1/04 |
| JP | 10-035827 A | | 2/1998 | |
| JP | 10-245106 A | | 9/1998 | |
| JP | 2004-196440 A | | 7/2004 | |
| KR | 2007-0037863 A | | 4/2007 | |
| KR | 20070037863 A | * | 4/2007 | ................. B25J 9/02 |
| KR | 1020070037863 A | * | 4/2007 | ................. B25J 9/02 |
| KR | 10 2007-0071564 A | | 7/2007 | |
| KR | 10 2008-0046380 A | | 5/2008 | |

OTHER PUBLICATIONS

Korean Office Action in KR 10-2009-0034715, dated May 25, 2011 (JUNG).
Japanese Office action in JP 2010-057615, dated Jun. 12, 2012 (JUNG).
Korean Notice of Allowance in KR-10-2009-0034715, dated Dec. 2, 2011 (JUNG).
JP Office Action dated Nov. 6, 2012.

* cited by examiner

*Primary Examiner* — Gene Crawford
*Assistant Examiner* — Kyle Logan
(74) *Attorney, Agent, or Firm* — Lee & Morse, P.C.

(57) ABSTRACT

A stocker system and a method of managing a stocker, the stocker system including a stocker, a rack master, and a sensor to easily examine a shelf of the stocker. The stocker includes the shelf on which a product is loaded. The rack master includes a body part and an arm part connected to the body part to move the product toward or away from the stocker. The sensor unit faces the shelf when the arm part is moved above or below the shelf and the sensor unit is disposed on the arm part. The sensor unit includes a facing surface that is not in contact with the arm part. A plurality of displacement sensors is disposed on the facing surface of the sensor unit to measure relative positions between the sensor unit and the shelf at a plurality of positions.

28 Claims, 7 Drawing Sheets

STOCKER SYSTEM AND METHOD OF MANAGING STOCKER

CROSS-REFERENCE TO RELATED APPLICATION

This application claims the benefit of Korean Application No. 10-2009-0034715, filed Apr. 21, 2009 in the Korean Intellectual Property Office, the disclosure of which is incorporated herein by reference.

BACKGROUND OF THE INVENTION

1. Field of the Invention

Aspects of the present invention relate to a stocker system and a method of managing a stocker, and more particularly, to a stocker system that easily manages a shelf of a stocker and a method of managing the stocker.

2. Description of the Related Art

Stockers are used to load products, and generally include a plurality of shelves that each load one product. The stocker may load various products, such as masks used in a photolithography or deposition process, cassettes containing wafers for manufacturing a semiconductor, and cassettes around which substrates for manufacturing a plasma display panel are wound.

A rack master to which an arm is attached is used to load products in the stocker and to carry out or transfer the loaded products. The rack master may automatically load or transfer the products while the rack master is moved using a member such as a rail.

However, when the stocker is used, the shelves on which products are loaded may be deformed or inclined to have shapes and/or positions different from their initial state. When the shelves are inclined, damaged, and/or lose their flatness, the products loaded on the shelves may be damaged. In addition, when the products are not loaded in a horizontal state but in an inclined state, the quality of the products may be affected. Thus, it is necessary to periodically examine the shelves of the stocker.

However, it is difficult to examine the shelves of the stocker by workers or using equipment because the inside of the stocker must be maintained in a clean state and not be contaminated by foreign substances. Also, the workers can not efficiently examine the shelves of the stocker because an inner space of the stocker is narrow.

SUMMARY OF THE INVENTION

Aspects of the present invention provide a stocker system that efficiently examines shelves of a stocker, and a method of managing the stocker.

According to an aspect of the present invention, there is provided a stocker system including: a stocker including a shelf on which a product is loaded; a rack master including a body part and an arm part connected to the body part to move the product toward or away from the stocker; and a sensor unit disposed on the arm part, wherein the sensor unit faces the shelf when the arm part is moved above or below the shelf when the sensor unit is disposed on the arm part and includes a facing surface that is not in contact with the arm part, and displacement sensors are disposed on a plurality of positions of the facing surface of the sensor unit to measure relative positions between the sensor unit and the shelf at the plurality of positions.

According to an aspect of the present invention, the plurality of positions may overlap with the shelf when the arm part is moved above or below the shelf and the sensor unit is disposed on the arm part.

According to an aspect of the present invention, the displacement sensors may include at least two displacement sensors disposed at symmetrical positions with respect to a middle region of the shelf when the arm part is above or below the shelf and the sensor unit is disposed on the arm part.

According to an aspect of the present invention, the shelf may include a first support and a second support that are horizontally spaced apart from each other, and the displacement sensors may be disposed at positions corresponding to the first support and the second support when the arm part is moved above or below the shelf.

According to an aspect of the present invention, the displacement sensors may include a plurality of first displacement sensors disposed at positions corresponding to the first support and a plurality of second displacement sensors disposed at positions corresponding to the second support.

According to an aspect of the present invention, the facing surface of the sensor unit may be disposed around a lateral surface of the arm part.

According to an aspect of the present invention, the stocker system may further include a control unit to measure a flatness of the at least one shelf using the relative position between the sensor unit and the at least one shelf measured by the displacement sensors, wherein the sensor unit may includes a wireless communication unit communicating with the control unit.

According to another aspect of the present invention, there is provided a method of managing a stocker including a stocker including a shelf on which a product is loaded, a rack master including a body part and an arm part connected to the body part to move the product toward or away from the stocker, and a sensor unit disposed on the arm part, the method including: disposing the sensor unit on the arm part; moving the arm part on which the sensor unit is disposed above or below the shelf; measuring relative positions between the sensor unit and the shelf at a plurality of positions using displacement sensors that are not in contact with the arm part in a region of the sensor unit facing the shelf; and determining the flatness of the shelf using the measured relative positions.

According to an aspect of the present invention, the displacement sensors may be disposed in a region of the sensor unit that overlaps with the shelf when the arm part is above or below the shelf.

According to an aspect of the present invention, at least two displacement sensors of the displacement sensors may be disposed at positions symmetrical to each other with respect to a middle region of the shelf when the arm part is above or below the shelf.

According to an aspect of the present invention, the shelf may include a first support and a second support that are horizontally spaced from each other, and the displacement sensors may be disposed at positions corresponding to the first support and the second support.

According to an aspect of the present invention, the displacement sensors may include a plurality of first displacement sensors disposed at positions corresponding to the first support and a plurality of second displacement sensors disposed at positions corresponding to the second support.

According to an aspect of the present invention, the displacement sensors may be disposed around lateral surfaces of the arm part.

According to an aspect of the present invention, the stocker may include a plurality of shelves on which a plurality of products are loaded, respectively, and the method may further include measuring the flatness of each of the shelves by sequentially performing the moving of the arm part to the upper side of the respective shelf, the measuring of the relative position between the sensor unit and the respective shelf, and the measuring of the flatness of the respective shelf for each of the shelves.

According to yet another aspect of the present invention, there is provided a rack system to move toward or away a shelf of a stocker, the rack system including: a rack master to move toward or away from the stocker and comprising a body part and an arm part connected to the body part to extend above or below the shelf; and a sensor unit disposed on the arm part and comprising a facing surface that is not in contact with the arm part, wherein the facing surface faces the shelf when the arm part is above or below the shelf, and the sensor unit further comprises displacement sensors respectively disposed on a plurality of positions of the facing surface to measure relative positions between the sensor unit and the shelf at the plurality of positions when the arm part is above or below the shelf.

According to still another aspect of the present invention, there is provided a sensor unit attached to a device that is disposed above or below a shelf of a stocker, the sensor unit including: a facing surface that faces the shelf; and displacement sensors respectively disposed on a plurality of positions of the facing surface to measure relative positions between the sensor unit and the shelf at the plurality of positions.

According to another aspect of the present invention, there is provided an apparatus to determine whether a shelf of a stocker is level, the apparatus including: a receiving unit to receive measurements of relative positions between the shelf and displacement sensors located at a plurality of positions above or below the shelf; and a control unit to determine whether the shelf is level using the measured relative positions between the displacement sensors and the shelf.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
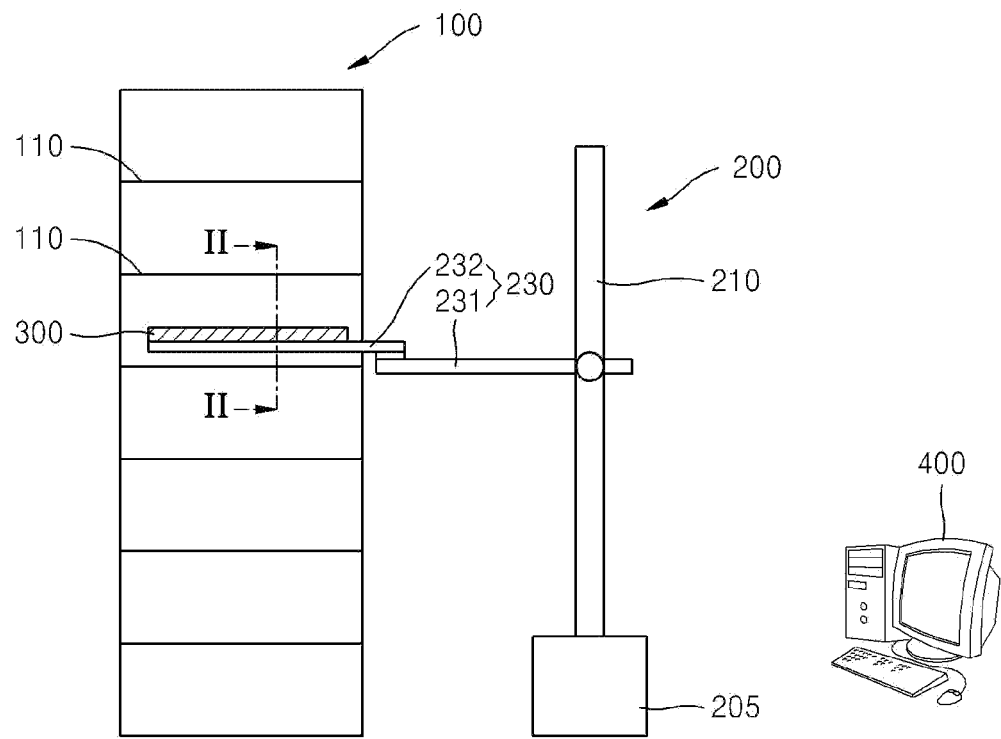
FIG. 1 is a schematic front view of a stocker system according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
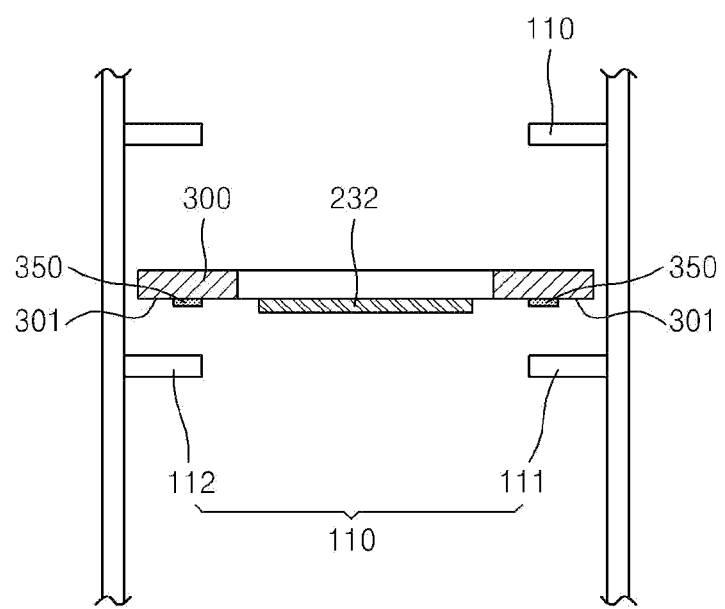
FIG. 2 is a cross-sectional view taken along line II-II of FIG. 1.

FIG. 1 is a schematic front view of a stocker system according to an embodiment of the present invention, and FIG. 2 is a cross-sectional view taken along line II-II of FIG. 1. Referring to FIGS. 1 and 2, the stocker system includes a stocker 100, a rack master 200, a sensor unit 300, and a control unit 400. While not required, the control unit 400 can be one or more processors or processing elements on one or more chips or integrated circuits, or may be a separately provided computer including one or more processors or processing elements.

The stocker 100 includes a plurality of shelves 110 on which products (such as masks, substrates, cassettes, etc.) may be loaded. The rack master 200 includes a moving part 205, a body part 210, and an arm part 230. The moving part 205 moves the rack master 200 to a desired position of the stocker 100. As an example, the moving part 205 may include a structure having a rail shape. The body part 210 is connected to the moving part 205. The arm part 230 is connected to the body part 210 and is movable vertically and horizontally to load a product on a desired shelf 110 of the stocker 100. The arm part 230 may be detachably connected to the body part 210, though aspects of the present invention are not limited thereto. The arm part 230 includes an arm base 231 and a robot arm 232. The arm base 231 is connected to the body part 210 as a base of the arm part 230. The robot arm 232 lifts the products to load the products on the shelves 110.

The sensor unit 300 is disposed on the arm part 230. In particular, the sensor unit 300 is disposed on the robot arm 232. The sensor unit 300 includes a plurality of displacement sensors 350 that are disposed on a facing surface 301 of the sensor unit 300. The facing surface 301 of the sensor unit 300 is an exposed surface that is not in contact with the robot arm 232 when the sensor unit 300 is disposed on the robot arm 232, and is a surface facing a lower shelf 110 when the robot arm 232 is moved toward an upper side of the shelf 110.

As shown in FIG. 2, the displacement sensors 350 are disposed in regions in which the sensor unit 300 overlaps with the shelf 110 when the robot arm 232 is moved toward the upper side of the shelf 110. Thus, the displacement sensors 350 may measure a relative position between the sensor unit 300 and the shelf 110 at a plurality of positions. That is, a vertical distance between the sensor unit 300 and the shelf 110 may be measured at the plurality of positions, as will be described in detail later.

In the shown embodiment, the arm part 230 is divided into the robot arm 232 and the arm base 231. However, aspects of the present invention are not limited thereto. For example, the arm base 231 and the robot arm 232 may be integrated into one body to form the arm part 230. In such a case where the arm base 231 and the robot arm 232 are integrated into one body to form the arm part 230, the sensor part 250 is disposed on a surface of the arm part 230.

The control unit 400 includes a central processing unit (CPU) and wirelessly communicates with the sensor unit 300 to process data or control movement of the rack master 200 to load of the products. While described as wirelessly connected, it is understood that the control unit 400 can communicate using a wired connection and can be integrated into the stocker 100 and/or the rack master 200.

Referring to FIG. 2, the stocker 100 includes the plurality of shelves 110. Each of the shelves 110 includes a first support 111 and a second support 112 that are horizontally spaced from each other. The displacement sensors 350 of the sensor unit 300 are disposed at positions corresponding to the first support 111 and the second support 112, respectively.

Figure 3:
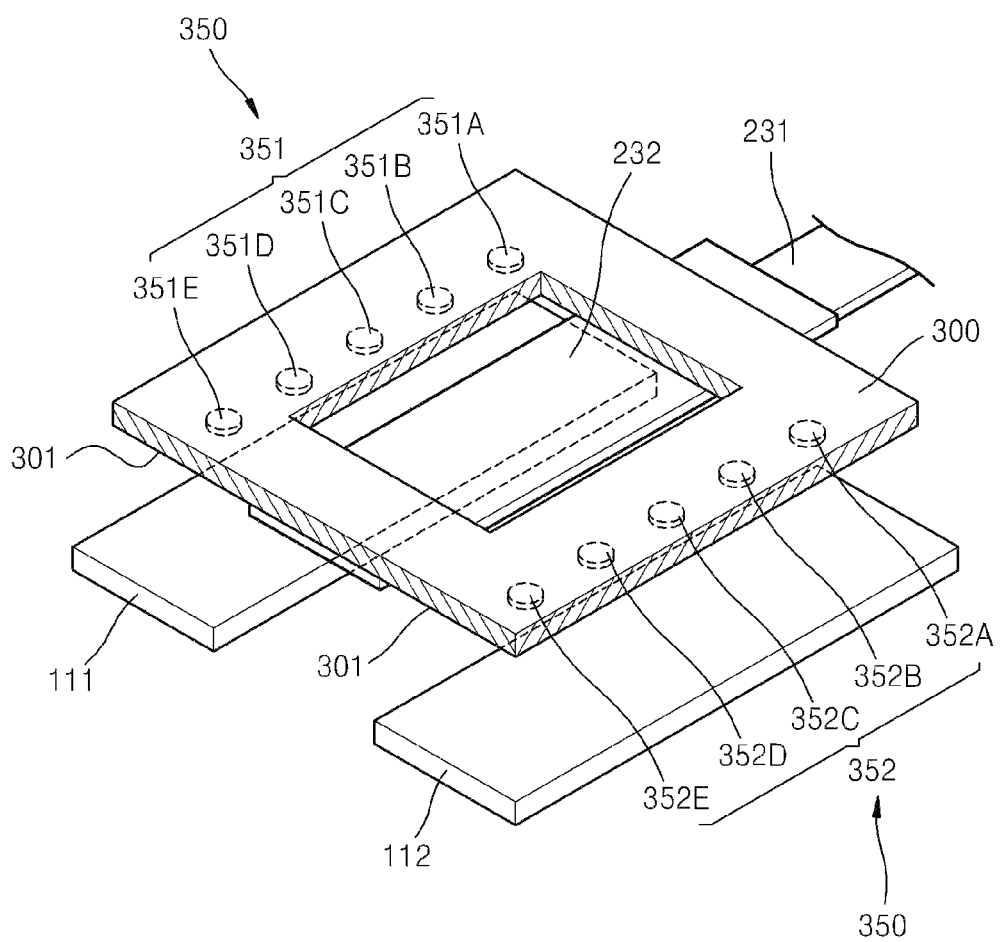
FIG. 3 is a transparent perspective view of a sensor unit of FIG. 1.

FIG. 3 is a transparent perspective view of the sensor unit 300 of FIG. 1. For convenience in description, one shelf 110, the arm base 231, the robot arm 232, and the sensor unit 300 are illustrated. Referring to FIG. 3, the shelf includes the first support 111 and the second support 112. The sensor unit 300 includes the displacement sensors 350, which include a first sensor 351 and a second sensor 352, respectively.

The first sensor 351 is disposed on a region of the facing surface 301 of the sensor unit 300 at a position corresponding to the first support 111. The second sensor 352 is disposed on a region of the facing surface 301 at a position corresponding to the second support 112. Furthermore, the first sensor 351 includes first sensors A 351A through E 351E in a lengthwise direction of the arm base 231. Similarly, the second sensor 352 includes second sensors A 352A through E 352E in the lengthwise of the arm base 231. However, it is understood that aspects of the present invention are not limited to five first sensors A 351A through E 351E and five second sensors A 352A through E 352E. For example, according to other aspects, the first sensor 351 may include two first sensors and the second sensor 352 may include two second sensors.

Figure 4:
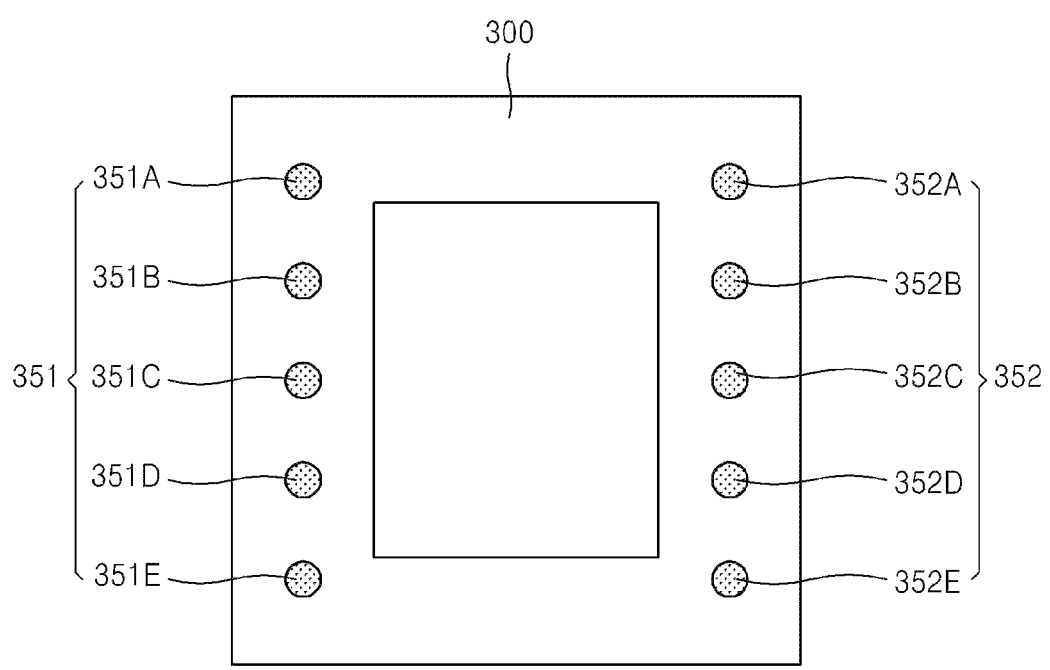
FIG. 4 is a schematic bottom view of the sensor unit of FIG. 1.

FIG. 4 is a schematic bottom view of the sensor unit 300 of FIG. 1. That is, FIG. 4 is a bottom view when the sensor unit 300 illustrated in FIG. 3 is viewed from the robot arm 232. Referring to FIG. 4, the sensor unit 300 has a tetragonal ring shape, though it is understood that aspects of the present invention are not limited thereto, and the sensor unit 300 may have any shape in which a plurality of sensors can be disposed to measure distances between the sensor unit and a shelf 110 at a plurality of positions. The first sensor 351 and the second sensor 352 are disposed on the facing surface 301 of the sensor unit 300 (i.e., a surface facing the shelf 110).

Figure 5:
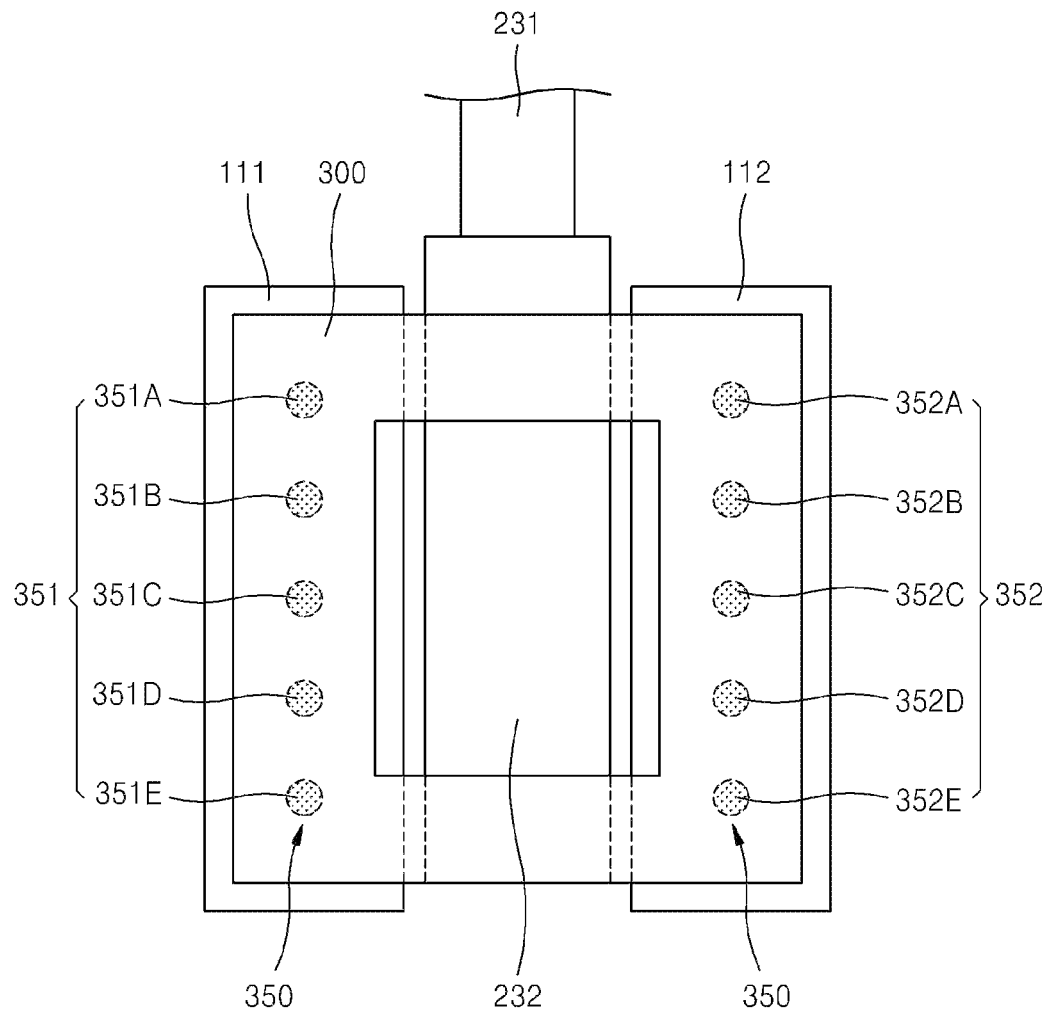
FIG. 5 is a transparent plan view of FIG. 3 when viewed from the top.

FIG. 5 is a transparent plan view of FIG. 3 when viewed from the top. Referring to FIG. 5, the first sensor A 351A and the second sensor A 352A are axisymmetrically disposed with respect to the first support 111 and the second support 112 in a state where the robot arm 232 is moved to the upper side of the shelf 110. Similarly, the first sensor B 351B and the second sensor B 352B, the first sensor C 351C and the second sensor C 352C, the first sensor D 351D and the second sensor D 352D, and the first sensor E 351E and the second sensor E 352E are axisymmetrically disposed with respect to the first support 111 and the second support 112, respectively. However, it is understood that aspects of the present invention are not limited thereto. For example, according to other aspects, the respective sensors 351 and 352 may be asymmetrically disposed in a staggered fashion.

Each of the displacement sensors 350 disposed on the sensor unit 300 measures positions of the shelf 110 relative to the remaining displacement sensors 350 in order to measure or to detect an inclination of the shelf 110. In particular, the sensor unit 300 includes the plurality of displacement sensors 350 so as to measure the displacement of the shelf 110 at a plurality of positions in order to measure the flatness (i.e., levelness) of the shelf 110. Furthermore, at least two sensors 351 and 352 from among the displacement sensors 350 may be disposed at positions corresponding to each other with respect to the region of the shelf 110 to further precisely measure the flatness of the shelf 110.

Figure 6:
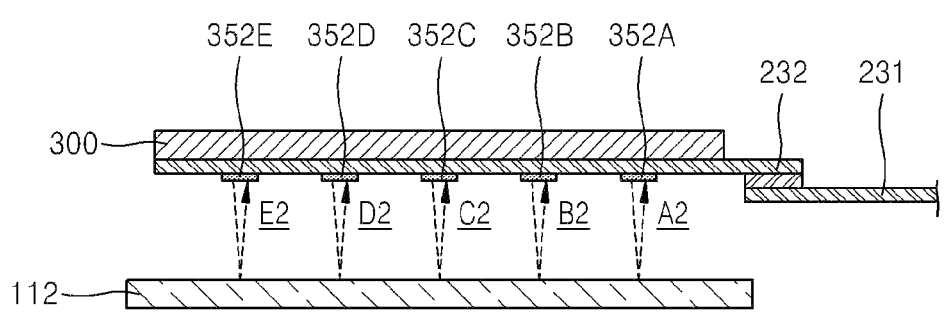
FIGS. 6 and 7 are left and right side views of FIG. 3, respectively.
Figure 7:
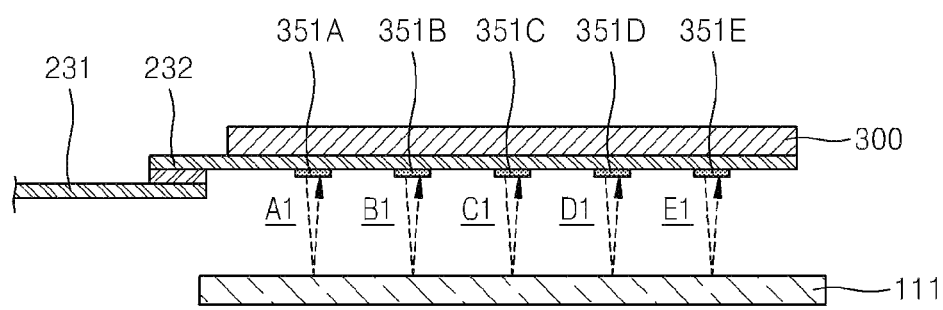

FIGS. 6 and 7 are left and right side views of FIG. 3, respectively. FIGS. 6 and 7 schematically illustrate a process in which the displacement sensors 350 disposed on the sensor unit 300 sense the shelf 110. FIG. 6 is a right side view of FIG. 3 and a lateral view when viewed from the second support 112. Referring to FIG. 6, each of the second sensors A 352A through E 352E measures a distance between the sensor unit 300 and the second support 112. Specifically, each of the second sensors A 352A through E 352E measure the distance between the sensor unit 300 and the second support 112 in a state where the robot arm 232 is moved to an upper side of the second support 112.

The second sensors A 352A through E 352E may each include a laser displacement sensor (not shown). Referring to the second sensor A 352A as an example, when the second sensor A 352A includes the laser displacement sensor, the second sensor A 352A may also include a laser irradiating part (not shown) and a light receiving part (not shown). In this case, the second sensor A 352A measures a distance A2 that a laser irradiated from the laser irradiating part is reflected by a surface of the second support 112 and incident to the light receiving part. Similarly, the second sensor B 352B, the second sensor C 352C, the second sensor D 352D, and the second sensor E 352E measure distances B2, C2, D2, and E2 that the laser irradiated from the laser irradiating part is reflected by the surface of the second support 112 of the shelf 110 and incident to the light receiving part, respectively.

FIG. 7 is a left side view of FIG. 3 and a lateral view when viewed from a direction of the first support 111. Referring to FIG. 7, each of the first sensors A 351A through E 351E measures a distance between the sensor unit 300 and the first support 111. Specifically, each of the first sensors A 351AA through E 351E measure the distance between the sensor unit 300 and the first support 111 in a state where the robot arm 232 is moved to an upper side of the first support 111.

The first sensors A 351A through E 351E may each include a laser displacement sensor (not shown). Referring to the first sensor A 351A as an example, when the first sensor A 351A includes the laser displacement sensor, the first sensor A 351A may further include a laser irradiating part (not shown) and a light receiving part (not shown). In this case, the first sensor A 351A measures a distance A1 that a laser irradiated from the laser irradiating part is reflected by a surface of the first support 111 and incident to the light receiving part. Similarly, the first sensor B 351 B, the first sensor C 351C, the first sensor D 351D, and the first sensor E 351E measure distances B1, C1, D1, and E1 that the laser irradiated from the laser irradiating part is reflected by the surface of the first support 111 of the shelf 110 and incident to the light receiving part, respectively.

The inclination of the shelf 110 may be confirmed using the measured distances A1, B1, C1, D1, E1, A2, B2, C2, D2, and E2. Particularly, data of the measured distances A1, B1, C1, D1, E1, A2, B2, C2, D2, and E2 are transmitted to the control unit 400 through a wireless communication unit (not shown) provided in the sensor unit 300. The wireless communication unit may be applicable to any wireless communication protocol between the control unit 400 with the sensor unit 300. For example, the wireless communication unit may include an Infrared communication unit, a Bluetooth communication unit, an 802.11 a/b/g/n communication unit, etc. Furthermore, it is understood that aspects of the present invention are not limited to wireless communication, and the sensor unit 300 may transmit data to the control unit 400 via a wired connection or a combination of wired and wireless connections.

The control unit 400 measures the flatness (i.e., levelness) of the shelf 110 using the transmitted distance data. That is, the distances measured using the displacement sensors 350 of the sensor unit 300 correspond to the distance between the sensor unit 300 and the shelf 110. Thus, the relative position between the sensor unit 300 and the shelf 110 may be confirmed. Accordingly, the control unit 400 and/or a user determines that the shelf 110 is not inclined or curved, but flat (i.e., in a normal state), when distances between the sensor unit 300 and the shelf 100 measured at a plurality of positions are equal to each other. Specifically, when the distances A1, B1, C1, D1, and E1 are equal to each other, the first support 111 of the shelf 110 is not inclined, but flat. Also, when the distances A2, B2, C2, D2, and E2 are equal to each other, the second support 112 of the shelf 110 is not inclined, but flat.

Furthermore, it may be confirmed that the first support 111 and the second support 112 are not inclined, but parallel to each other, by comparing the distance A1 to the distance A2. Similarly, arrangement states of the first support 111 and the second support 112 may be confirmed by respectively comparing the distances B1, C1, D1, and E1 to the distances B2, C2, D2, and E2. Therefore, when the distances A1, B1, C1, D1, E1, A2, B2, C2, D2, and E2 are equal to each other, the shelf 110 is flat.

Figure 8:
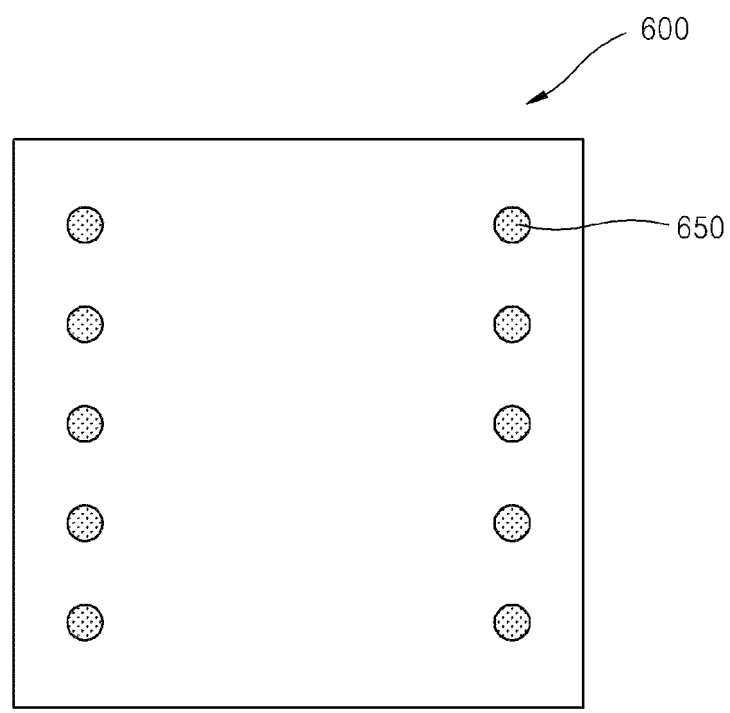
FIGS. 8 and 9 are bottom views of sensor units provided in a stocker system according to other embodiments of the present invention.
Figure 9:
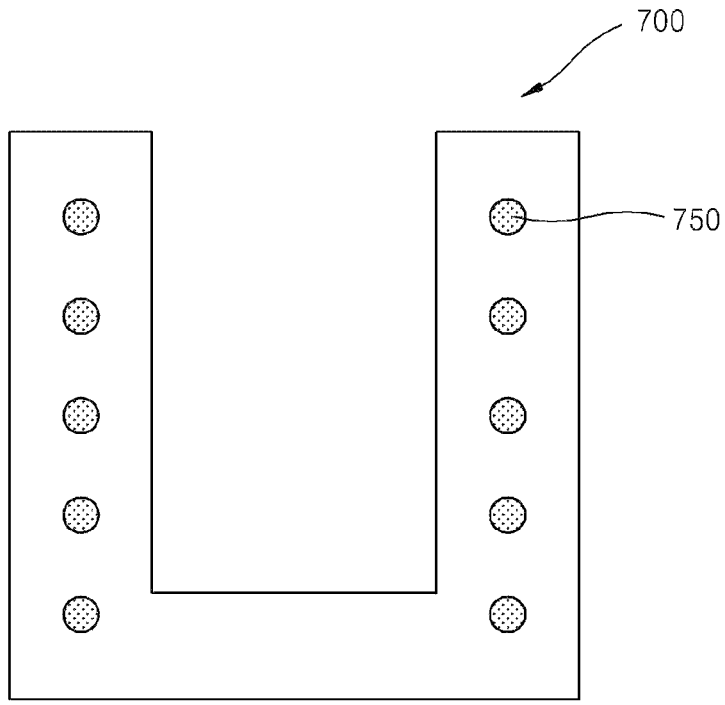

FIGS. 8 and 9 are bottom views of sensor units 600 and 700 provided in a stocker system, respectively, according to other embodiments of the present invention. Referring to FIG. 8, the sensor unit 600 has a tetragonal plate shape. Displacement sensors 650 are disposed on positions corresponding to a shelf 110. Referring to FIG. 9, the sensor unit 700 has a U-shape. However, it is understood that aspects of the present invention are not limited thereto. That is, the sensor unit 300, 600, 700 may be formed in various shapes when the sensor unit 600 is disposed on an arm part, and the displacement sensors 350, 650, 750 are disposed on a surface of the sensor unit 600 corresponding to the shelf 110.

Figure 10:
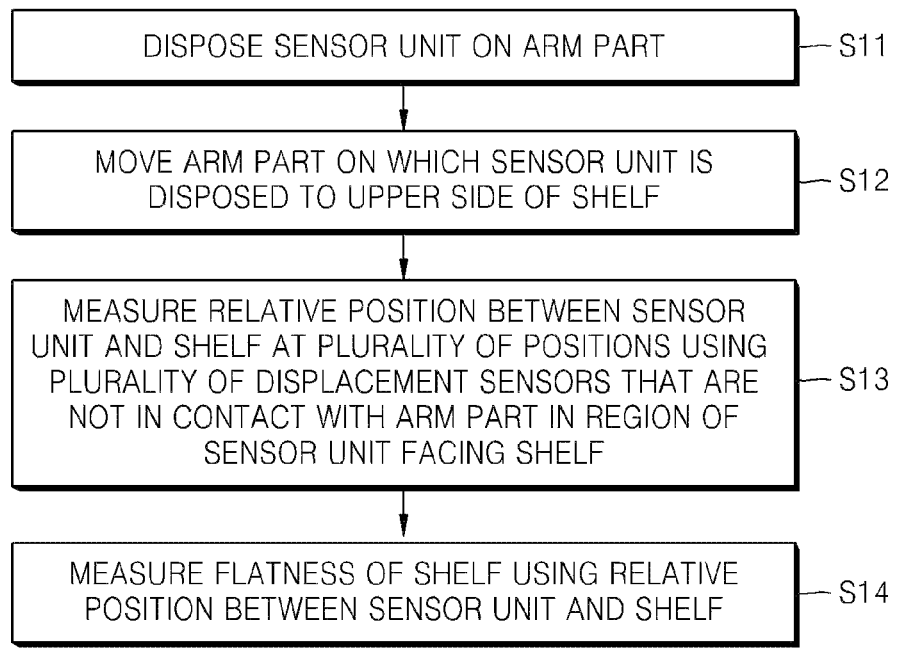
FIG. 10 is a flowchart illustrating a method of managing a stocker according to an embodiment of the present invention.

FIG. 10 is a flowchart illustrating a method of managing a stocker according to an embodiment of the present invention. Referring to FIG. 10, a sensor unit 300, 600, 700 is disposed on an arm part 230 in operation S11. The arm part 230 on which the sensor unit 300, 600, 700 is disposed is moved to an upper side of a shelf 110 in operation S12. A relative position between the sensor unit 300, 600, 700 and the shelf 110 is measured in operation S13 using a plurality of displacement sensors 350, 650, 750 that are not in contact with the arm part, but disposed in a region of the sensor unit 300, 600, 700 facing the shelf 110. The flatness of the shelf 110 is measured in operation S14 using the relative position between the sensor unit 300, 600, 700 and the shelf 110 measured through the displacement sensors 350, 650, 750 (operation S13).

In detail, the displacement sensors 350, 650, 750 disposed on the sensor unit 300, 600, 700 are disposed on a lateral surface of the arm part 230 when the sensor unit 300, 600, 700 is disposed on the arm part 230 in operation S11. Thus, the displacement sensors 350, 650, 750 are not in contact with the arm part 230. Also, the arm part 230 is moved to the upper side of the shelf 110 in operation S12. A height between the arm part 230 and the shelf 110 is adequately adjusted so that the sensor unit 300, 600, 700 disposed on the arm part 230 does not contact with the shelf 110. That is, a predetermined distance (i.e., movement range) of the arm part 230 is adjusted so that the displacement sensors 350, 650, 750 of the sensor unit 300, 600, 700 correspond to the shelf 110.

A distance between the sensor unit 300, 600, 700 and the shelf 110 is measured using the displacement sensors 350, 650, 750 in operation S13. To precisely measure the distance between the sensor unit 300, 600, 700 and the shelf 110, the sensor unit 300, 600, 700 is not moved after the sensor unit 300, 600, 700 is moved to the upper side of the shelf 110. Accordingly, the flatness of the shelf 110 is measured using data measured by the displacement sensors 350, 650, 750. When the data measured by the displacement sensors 350, 650, 750 have the same value or differ by less than a predetermined value, the flatness of the shelf 110 is in a normal state. However, when the data measured by the displacement sensors 350, 650, 750 are not equal to each other and have different values, the flatness of the shelf 110 is in an abnormal state. In this case, the shelf 110 may be corrected or replaced.

Figure 11:
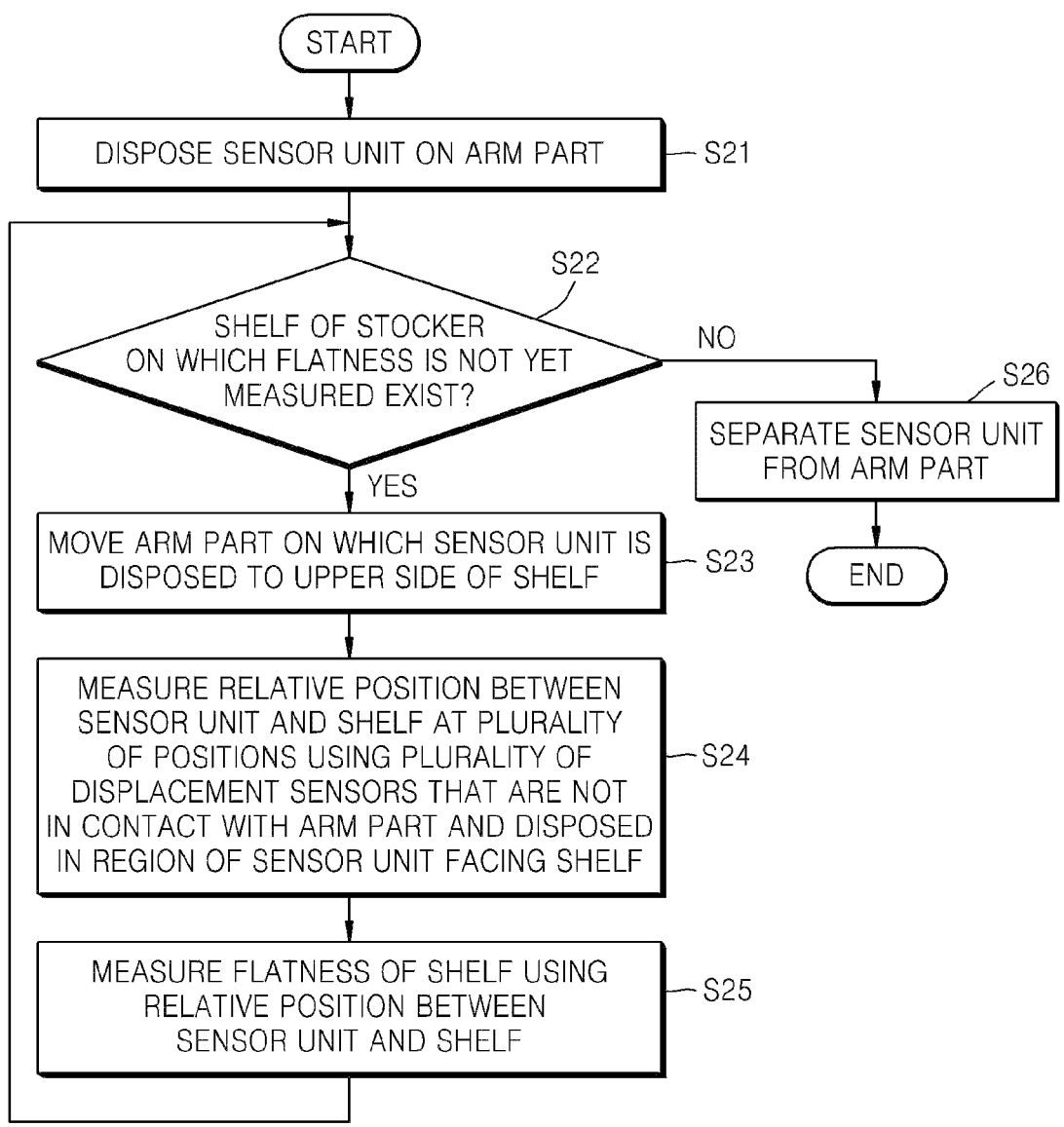
FIG. 11 is a flowchart illustrating a method of managing stocker according to another embodiment of the present invention.

FIG. 11 is a flowchart illustrating a method of managing stocker according to another embodiment of the present invention. Referring to FIG. 11, a sensor unit 300, 600, 700 is disposed on an arm part 230 in operation S21. The arm part on which the sensor unit 300, 600, 700 is disposed is moved to an upper side of a shelf 110 in operation S23. A relative position between the sensor unit 300, 600, 700 and the shelf 110 is measured in operation S24 using a plurality of displacement sensors 350, 650, 750 that are not in contact with the arm part 230, but disposed in a region of the sensor unit 300, 600, 700 facing the shelf 110. The flatness of the shelf 110 is measured using the relative position between the sensor unit 300, 600, 700 and the shelf 110 measured through the displacement sensors 350, 650, 750 (operation S25).

Furthermore, a control unit 400 detects whether all of shelves 110 of a stocker 100 have been measured in operation S21. If a shelf 110 of the stocker 110 has not been measured, operations S23, S24, and S25 are performed sequentially and repeatedly to measure the flatness of the shelves until all of the shelves have been measured. The sequential operations S23, S24, and S25 are performed through a control unit 400 including a CPU. If the flatness of all of the shelves 110 of the stocker 100 are measured, the sensor unit 300, 600, 700 is separated from the arm part 230 to finish the above-described method. Thus, the flatness of all of the shelves 110 of the stocker 100 may be sequentially measured.

While aspects of the present invention have been described to measure a relative position between the sensor unit 300, 600, 700 and the shelf 110 above the shelf, it is understood that the invention is not limited thereto. For example, according to other aspects, the sensor unit 300, 600, 700 may be positioned below the shelf 110 to determine a flatness of the shelf 110. Moreover, while described in terms of measuring a flatness of a shelf 110, aspects can be used to confirm any predetermined shape and/or to ensure a shelf or surface has a needed slope.

According to aspects of the present invention, the shelves 110 of the stocker 100 can be easily examined, and the flatness of the shelves 110 of the stocker 100 can be easily examined.

While not restricted thereto, aspects of the present invention can also be embodied as computer-readable code on a computer-readable recording medium. The computer-readable recording medium is any data storage device that can store data that can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network-coupled computer systems so that the computer-readable code is stored and executed in a distributed fashion. Aspects of the present invention may also be realized as a data signal embodied in a carrier wave and comprising a program readable by a computer and transmittable over the Internet.

Although a few embodiments of the present invention have been shown and described, it would be appreciated by those skilled in the art that changes may be made in this embodiment without departing from the principles and spirit of the invention as defined in the claims and their equivalents.

What is claimed is:

1. A stocker system, comprising:
a stocker comprising a shelf on which a product is loaded;
a rack master to move toward or away from the stocker and comprising a body part and an arm part connected to the body part to carry the product;
a sensor unit disposed on the arm part and comprising a facing surface that is not in contact with the arm part; and
a control unit to determine whether the shelf is level, wherein:
the facing surface faces the shelf when the arm part is above or below the shelf, and the sensor unit further includes displacement sensors respectively disposed on a plurality of positions of the facing surface to measure relative positions between the sensor unit and the shelf at the plurality of positions when the arm part is above or below the shelf,
the displacement sensors include a plurality of first displacement sensors arranged in a first direction and a plurality of second displacement sensors arranged in the first direction, the first sensors spaced from and aligned with respective ones of the second sensors in a second direction crossing the first direction,
the sensor unit includes a wireless communication unit to transmit the measured relative positions to the control unit, and
the control unit determines that the shelf is level in the first direction when the relative positions between the sensor unit and the shelf measured by the first displacement sensors arranged in the first direction are substantially equal, when the relative positions between the sensor unit and shelf measured by the second displacement sensors arranged in the first direction are substantially equal, and when the relative positions between the sensor unit and shelf measured by the first and second displacement sensors respectively aligned in the second direction, when compared, are determined to be substantially equal.

2. The stocker system as claimed in claim 1, wherein the plurality of positions of the facing unit overlaps with the shelf when the arm part is above or below the shelf.

3. The stocker system as claimed in claim 1, wherein the first and second displacement sensors are disposed at symmetrical positions with respect to a middle region of the shelf when the arm part is above or below the shelf.

4. The stocker system as claimed in claim 1, wherein the facing surface of the sensor unit is disposed around a lateral surface of the arm part.

5. The stocker system as claimed in claim 1, wherein each of the displacement sensors comprises a laser irradiating part to irradiate a laser toward the shelf and a light receiving part to receive the laser reflected by a surface of the shelf in order to measure the relative positions between the sensor unit and the shelf.

6. A stocker system, comprising:
a stocker comprising a shelf on which a product is loaded;
a rack master to move toward or away from the stocker and comprising a body part and an arm part connected to the body part to carry the product; and
a sensor unit disposed on the arm part and comprising a facing surface that is not in contact with the arm part, wherein:
the facing surface faces the shelf when the arm part is above or below the shelf, and the sensor unit includes displacement sensors respectively disposed on a plurality of positions of the facing surface to measure relative positions between the sensor unit and the shelf at the plurality of positions when the arm part is above or below the shelf,
the shelf comprises a first support and a second support that are horizontally spaced from each other, and
the plurality of positions of the facing surface correspond to the first support and the second support when the arm part is above or below the shelf.

7. The stocker system as claimed in claim 6, wherein the displacement sensors comprise a plurality of first displacement sensors disposed at positions corresponding to the first support and a plurality of second displacement sensors disposed at positions corresponding to the second support.

8. The stocker system as claimed in claim 7, wherein:
the first displacement sensors comprise at least two first displacement sensors disposed at symmetrical positions with respect to a middle region of the first support when the arm part is above or below the shelf; and
the second displacement sensors comprise at least two second displacement sensors disposed at symmetrical positions with respect to a middle region of the second support when the arm part is above or below the shelf.

9. The stocker system as claimed in claim 8, further comprising:
a control unit to determine whether the first support is level using the measured relative positions between the at least two first displacement sensors and the first support, and to determine whether the second support is level using the measured relative positions between the at least two second displacement sensors and the second support,
wherein the sensor unit comprises a wireless communication unit to transmit the measured relative positions to the control unit.

10. The stocker system as claimed in claim 9, wherein the control unit determines that the first support is level when the measured relative positions between the at least two first displacement sensors and the first support are equal, and the control unit determines that the second support is level when the measured relative positions between the at least two second displacement sensors and the second support are equal.

11. The stocker system as claimed in claim 9, wherein the control unit determines that the shelf is level when the measured relative positions between the at least two first displacement sensors and the first support and the measured relative positions between the at least two second displacement sensors and the second support are equal.

12. A stocker system comprising:
a stocker comprising a shelf on which a product is loaded;
a rack master to move toward or away from the stocker and comprising a body part and an arm part connected to the body part to carry the product;
a sensor unit disposed on the arm part and comprising a facing surface that is not in contact with the arm part; and
a control unit to determine whether the shelf is level, wherein:
the facing surface faces the shelf when the arm part is above or below the shelf, and the sensor unit further includes displacement sensors respectively disposed on a plurality of positions of the facing surface to measure relative positions between the sensor unit and the shelf at the plurality of positions when the arm part is above or below the shelf, the sensor unit includes a wireless communication unit to transmit the measured relative positions to the control unit, and the control unit determines that the shelf is level when the measured relative positions between the sensor unit and the shelf are substantially equal, wherein the sensor unit has a tetragonal shape or a U-shape.

13. A method of managing a stocker comprising a stocker comprising a shelf on which a product is loaded, a rack master to move toward or away from the stocker and comprising a body part and an arm part connected to the body part to carry the product, and a sensor unit disposed on the arm part and comprising a facing surface that is not in contact with the arm part, the method comprising:

moving the arm part on which the sensor unit is disposed above or below the shelf such that the facing surface faces the shelf, the shelf including a first support and a second support that are horizontally spaced from each other;

measuring, by displacement sensors, relative positions between the sensor unit and the shelf at a plurality of positions of the facing surface such that the plurality of positions of the facing surface correspond to the first support and the second support when the arm part is above or below the shelf; and determining a flatness of the shelf using the measured relative positions between the sensor unit and the shelf, wherein the displacement sensors are respectively disposed on the plurality of positions of the facing surface.

14. The method as claimed in claim 13, further comprising disposing the sensor unit on the arm part.

15. The method as claimed in claim 13, wherein the plurality of positions of the facing unit overlaps with the shelf when the arm part is above or below the shelf.

16. The method as claimed in claim 13, wherein the displacement sensors comprise at least two displacement sensors disposed at symmetrical positions with respect to a middle region of the shelf when the arm part is above or below the shelf.

17. The method as claimed in claim 13, wherein the displacement sensors comprise a plurality of first displacement sensors disposed at positions corresponding to the first support and a plurality of second displacement sensors disposed at positions corresponding to the second support.

18. The method as claimed in claim 13, wherein the facing surface of the sensor unit is disposed around a lateral surface of the arm part.

19. The method as claimed in claim 13, further comprising:
determining a flatness of each of a plurality of shelves of the stocker by sequentially performing the moving of the arm part above or below the respective shelf, the measuring of the relative positions between the sensor unit and the respective shelf, and the measuring of the flatness of the shelf for each of the plurality of shelves.

20. A rack system to move toward or away a shelf of a stocker, the rack system comprising:

a control unit to determine whether the shelf is level;

a rack master to move toward or away from the stocker and comprising a body part and an arm part connected to the body part to extend above or below the shelf; and a sensor unit disposed on the arm part and comprising a facing surface that is not in contact with the arm part, wherein:

the facing surface faces the shelf when the arm part is above or below the shelf, and the sensor unit further comprises displacement sensors respectively disposed on a plurality of positions of the facing surface to measure relative positions between the sensor unit and the shelf at the plurality of positions when the arm part is above or below the shelf, and the control unit determines the shelf is level when the measured relative positions between the sensor unit and the shelf are substantially equal, wherein:

the displacement sensors include a plurality of first displacement sensors arranged in a first direction and a plurality of second displacement sensors arranged in the first direction, the first sensors spaced from and aligned with respective ones of the second sensors in a second direction crossing the first direction, and the control unit determines that the shelf is level in the first direction when the relative positions between the sensor unit and the shelf measured by the first displacement sensors arranged in the first direction are substantially equal, when the relative positions between the sensor unit and shelf measured by the second displacement sensors arranged in the first shelf measured by the first and second displacement sensors respectively aligned in the second direction, when compared, are determined to be substantially equal.

21. The rack system as claimed in claim 20, wherein the plurality of positions of the facing surface correspond to a first support and a second support of the shelf that are horizontally spaced from each other, when the arm part is above or below the shelf 22. The rack system as claimed in claim 21, wherein the displacement sensors comprise a plurality of first displacement sensors disposed at positions corresponding to the first support and a plurality of second displacement sensors disposed at positions corresponding to the second support.

23. The rack system as claimed in claim 22, wherein:
the first displacement sensors comprise at least two first displacement sensors disposed at symmetrical positions with respect to a middle region of the first support when the arm part is above or below the shelf; and the second displacement sensors comprise at least two second displacement sensors disposed at symmetrical positions with respect to a middle region of the second support when the arm part is above or below the shelf 24. The rack system as claimed in claim 23, further comprising:
a control unit to determine whether the first support is level using the measured relative positions between the at least two first displacement sensors and the first support, and to determine whether the second support is level using the measured relative positions between the at least two second displacement sensors and the second support.

25. The rack system as claimed in claim 24, wherein the control unit determines that the first support is level when the measured relative positions between the at least two first displacement sensors and the first support are equal, and the control unit determines that the second support is level when the measured relative positions between the at least two second displacement sensors and the second support are equal.

26. The rack system as claimed in claim 24, wherein the control unit determines that the shelf is level when the measured relative positions between the at least two first displacement sensors and the first support and the measured relative positions between the at least two second displacement sensors and the second support are equal.

27. A sensor unit attached to a device that is disposed above or below a shelf of a stocker, the sensor unit comprising:
- a facing surface that faces the shelf;
- displacement sensors respectively disposed on a plurality of positions of the facing surface to measure relative positions between the sensor unit and the shelf at the plurality of positions; and
- a connection to a control unit, which control unit determines whether the shelf is level such that the control unit determines the shelf is level when the measured relative positions between the sensor unit and the shelf are equal, wherein the sensor unit is detachably attached to the device.

28. The sensor unit as claimed in claim 27, wherein:
- all of the displacement sensors are disposed on the facing surface facing a same side of the shelf, and
- the displacement sensors include a plurality of first displacement sensors arranged in a first direction and a plurality of second displacement sensors arranged in the first direction, the first displacement sensors spaced from and aligned with respective ones of the second displacement sensors in a second direction crossing the first direction.

* * * * *